United States Patent
Senzaki et al.

(10) Patent No.: US 9,029,262 B2
(45) Date of Patent: May 12, 2015

(54) METHOD OF FORMING CONTACT HOLE PATTERN

(71) Applicants: Tokyo Ohka Kogyo Co., Ltd., Kawasaki-shi (JP); Riken, Wako-shi (JP)

(72) Inventors: Takahiro Senzaki, Kawasaki (JP); Ken Miyagi, Kawasaki (JP); Shigenori Fujikawa, Wako (JP)

(73) Assignees: Tokyo Ohka Kogyo Co., Ltd., Kawasaki-shi (JP); Riken, Wako-shi (JP)

( * ) Notice: Subject to any disclaimer, the term of this patent is extended or adjusted under 35 U.S.C. 154(b) by 125 days.

(21) Appl. No.: 13/761,509

(22) Filed: Feb. 7, 2013

(65) Prior Publication Data

US 2013/0210231 A1     Aug. 15, 2013

(30) Foreign Application Priority Data

Feb. 9, 2012  (JP) ................................ 2012-026000

(51) Int. Cl.
| | |
|---|---|
| H01L 21/768 | (2006.01) |
| G03F 7/00 | (2006.01) |
| H01L 21/027 | (2006.01) |
| H01L 21/033 | (2006.01) |
| H01L 21/311 | (2006.01) |

(52) U.S. Cl.
CPC ............ *H01L 21/76802* (2013.01); *G03F 7/00* (2013.01); *H01L 21/0271* (2013.01); *H01L 21/0337* (2013.01); *H01L 21/31144* (2013.01)

(58) Field of Classification Search
CPC .................... H01L 21/76802; H01L 21/0337; H01L 21/0271; H01L 21/31144; G03F 7/00
USPC .......................................................... 438/694
See application file for complete search history.

(56) References Cited

U.S. PATENT DOCUMENTS

2007/0224823 A1 *  9/2007  Sandhu ......................... 438/694
2010/0297847 A1    11/2010  Cheng et al.

FOREIGN PATENT DOCUMENTS

JP       A-2008-036491        2/2008

OTHER PUBLICATIONS

Hinsberg et al.; "Self-Assembling Materials for Lithographic Patterning: Overview, Status and Moving Forward," Proceedings of SPIE, vol. 7637, 76370G-1 (2010).

* cited by examiner

*Primary Examiner* — Duy Deo
*Assistant Examiner* — Mahmoud Dahimene
(74) *Attorney, Agent, or Firm* — Knobbe Martens Olson & Bear LLP

(57) ABSTRACT

A method of forming a contact hole pattern, including: a block copolymer layer forming step in which a layer containing a block copolymer having a plurality of blocks bonded is formed on a substrate having on a surface thereof a thin film with a hole pattern formed, so as to cover the thin film; a phase separation step in which the layer containing the block copolymer is subjected to phase separation; a selective removing step in which phase of at least one block of the plurality of blocks constituting the block copolymer is removed, wherein hole diameter of the hole pattern formed on the thin film is 0.8 to 3.1 times period of the block copolymer, and in the layer forming step, thickness between upper face of the thin film and surface of the layer containing the block copolymer is 70% or less of thickness of the thin film.

4 Claims, 1 Drawing Sheet

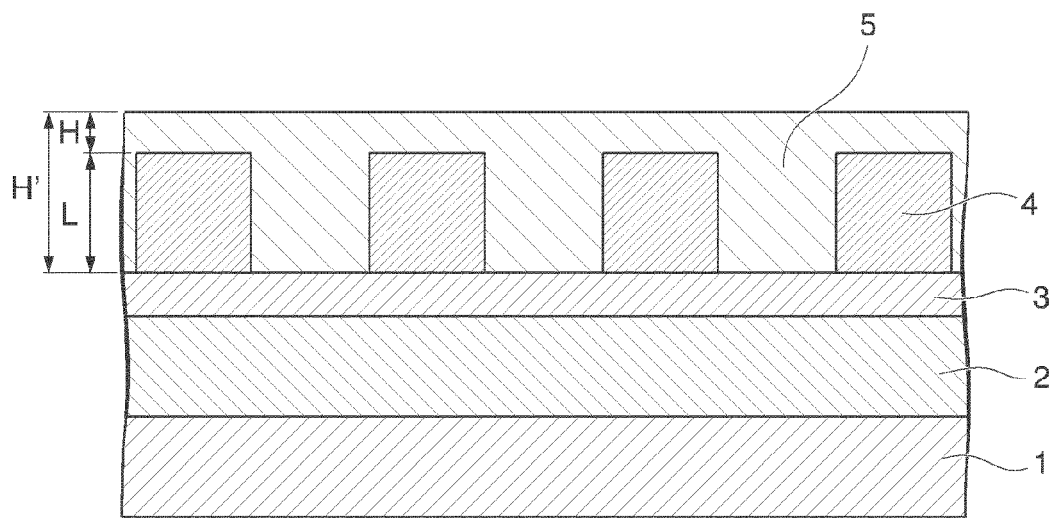

METHOD OF FORMING CONTACT HOLE PATTERN

TECHNICAL FIELD

The present invention is related to a method of forming a contact hole pattern with improved uniformity of the hole diameter and circularity by using a phase-separated structure of a block copolymer.

Priority is claimed on Japanese Patent Application No. 2012-026000, filed Feb. 9, 2012, the content of which is incorporated herein by reference.

DESCRIPTION OF RELATED ART

Recently, as further miniaturization of large scale integrated circuits (LSI) proceeds, a technology for processing a more delicate structure is demanded. In response to such demand, a method has been disclosed in which a fine pattern is formed using a phase-separated structure formed by self-assembly of a block copolymer having mutually incompatible blocks bonded together (see, for example, Patent Document 1).

For using a phase separation of a block copolymer, it is necessary to form a self-organized nano structure by a microphase separation only in specific regions, and arrange the nano structure in a desired direction. For realizing position control and orientational control, graphoepitaxy to control phase-separated pattern by a guide pattern and chemical epitaxy to control phase-separated pattern by difference in the chemical state of the substrate are proposed (see, for example, Non-Patent Document 1).

Further, with respect to a contact hole pattern formed on a resist film, the hole diameter and the shape tend to largely vary as the hole diameter becomes smaller. In this situation, a method has been proposed in which a block copolymer is applied to a resist film having a contact hole pattern formed thereon, and a phase-separation structure having a cylinder structure is formed, followed by selectively removing a phase constituting the center of the cylinder structure, thereby forming a contact hole having a relatively uniform hole diameter than the first contact hole pattern (see, for example, Patent Document 2).

DOCUMENTS OF RELATED ART

[Patent Document]
[Patent Document 1] Japanese Unexamined Patent Application, First Publication No. 2008-36491
[Patent Document 2] U.S. Publication No. 2010/0297847
[Non-Patent Documents]
[Non-Patent Document 1] Proceedings of SPIE (U.S.), vol. 7637, pp. 76730G-1 (2010)

SUMMARY OF THE INVENTION

Not all of the block copolymers that constitute the phase-separated structure contribute to improving the uniformity of the contact hole pattern and circularity. It has not been elucidated yet which block copolymer is capable of forming contact hole having a relatively uniform hole diameter.

The present invention takes the above circumstances into consideration, with an object of providing a method of forming a contact hole pattern with improved uniformity of the hole diameter and circularity more reliably by using a phase-separated structure of a block copolymer.

For solving the above-mentioned problems, the present invention employs the following aspects.

Specifically, a first aspect of the present invention is a method of forming a contact hole pattern, including: a block copolymer layer forming step in which a layer containing a block copolymer having a plurality of blocks bonded is formed on a substrate having on a surface thereof a thin film with a hole pattern formed, so as to cover the thin film; a phase separation step in which, after the block copolymer layer forming step, the layer containing the block copolymer is subjected to phase separation; a selective removing step in which, after the phase separation step, a phase of at least one block of the plurality of blocks constituting the block copolymer is removed, wherein the thin film is an organic or inorganic film that is photosensitive or non-photosensitive, a hole diameter of the hole pattern formed on the thin film is 0.8 to 3.1 times a period of the block copolymer, and in the block copolymer layer forming step, a thickness between an upper face of the thin film and a surface of the layer containing the block copolymer is 70% or less of a thickness of the thin film.

According to the present invention, the uniformity of the hole diameter and circularity of a hole pattern formed on a thin film such as a resist film can be more reliably improved.

BRIEF DESCRIPTION OF THE DRAWINGS

FIG. 1 is a schematic diagram showing an embodiment of a substrate having a layer containing a block copolymer formed thereon by a block copolymer layer forming step.

DETAILED DESCRIPTION OF THE INVENTION

The method of forming a contact hole pattern (hereafter, sometimes referred to as "CH pattern") according to the present invention includes forming a phase-separated structure of a block copolymer within the holes of a hole pattern formed on a thin film, followed by selectively removing a phase of at least one block of the plurality of blocks constituting the block copolymer so as to form a CH pattern of the block copolymer in the holes, wherein the hole diameter of the hole pattern formed on the thin film is 0.8 to 3.1 times a period of the block copolymer. By virtue of the hole diameter of the hole pattern being 0.8 to 3.1 times a period of the block copolymer, i.e., by using a block copolymer having a period of 0.3 to 1.3 times the hole diameter of the hole pattern, a phase of one cylinder structure can be more reliably formed near the center of one hole within a hole pattern by phase separation. By selectively removing the phase of the cylinder structure, a hole having a hole diameter smaller than the original hole can be formed with improved uniformity of the hole diameter and circularity.

Specifically, the method of forming a CFI pattern according to the present invention includes the following steps:

a block copolymer layer forming step in which a layer containing a block copolymer having a plurality of blocks bonded is formed on a substrate having on a surface thereof a thin film with a hole pattern formed, so as to cover the thin film;

a phase separation step in which, after the block copolymer layer forming step, the layer containing the block copolymer is subjected to phase separation; and a selective removing step in which, after the phase separation step, a phase of at least one block of the plurality of blocks constituting the block copolymer is removed.

Hereafter, each of the steps and the materials used will be explained in detail.

<Block Copolymer>

A block copolymer is a polymeric material in which plurality of blocks are bonded. As the blocks constituting the block copolymer, 2 types of blocks may be used, or 3 or more types of blocks may be used.

In the present invention, the plurality of blocks constituting the block copolymer are not particularly limited, as long as they are combinations capable of causing phase separation. However, it is preferable to use a combination of blocks which are mutually incompatible. Further, the block copolymer used in the present invention is a combination in which a phase of at least one block amongst the plurality of blocks constituting the block copolymer can be easily subjected to selective removal as compared to the phases of other blocks.

In the present invention and present specification, a "period of a block copolymer" refers to a period of a phase structure observed when a phase-separated structure is formed, and is a sum of the lengths of the phases which are mutually incompatible. Specifically, in the case of forming a cylinder structure which has a phase-separated structure perpendicular to a surface of a substrate, the period of the block copolymer is the center distance (pitch) of two mutually adjacent cylinder structures.

The period of a block polymer is determined by intrinsic polymerization properties such as the polymerization degree N and the Flory-Huggins interaction parameter $\chi$. Specifically, the repulsive interaction between different block components of the block copolymer becomes larger as the $\chi N$ becomes larger. Therefore, when $\chi N=10$ (hereafter, referred to as "strong segregation limit"), the repulsion between different blocks in the block copolymer becomes large, and there is a strong tendency for the phase separation to occur between different blocks in the block copolymer. At the strong segregation limit, the period of the block copolymer is approximately $N^{2/3}\chi^{1/6}$. That is, the period of the block copolymer is in proportion to the polymerization degree N which correlates with the molecular weight Mn and molecular weight ratio between different block components. Therefore, by adjusting the composition and the total molecular weight of the block copolymer to be used, the period of the block copolymer can be easily adjusted.

Examples of the block copolymer include a block copolymer having a block with a structural unit of styrene or a derivative thereof bonded to a block with a structural unit of a (meth)acrylate ester, a block copolymer having a block with a structural unit of styrene or a derivative thereof bonded to a block with a structural unit of a siloxane or a derivative thereof, and a block copolymer having a block with a structural unit of an alkylene oxide bonded to a block with a structural unit of a (meth)acrylate ester. Here, the term "(meth)acrylate ester" is a generic term that includes either or both of the acrylate ester having a hydrogen atom bonded to the $\alpha$-position and the methacrylate ester having a methyl group bonded to the $\alpha$-position.

As the (meth)acrylate ester, for example, (meth)acrylic acid having a substituent such as an alkyl group or a hydroxyalkyl group bonded to the carbon atom of the (meth)acrylic acid can be used. Examples of the alkyl group as the substituent include linear, branched or cyclic alkyl groups of 1 to 10 carbon atoms. Specific examples of the (meth)acrylate ester include methyl (meth)acrylate, ethyl (meth)acrylate, propyl (meth)acrylate, cyclohexyl (meth)acrylate, octyl (meth)acrylate, nonyl (meth)acrylate, hydroxyethyl (meth)acrylate, hydroxypropyl (meth)acrylate, benzyl (meth)acrylate, anthracene (meth)acrylate, glycidyl (meth)acrylate, 3,4-epoxycyclohexylmethane (meth)acrylate, and propyltrimethoxysilane (meth)acrylate.

Examples of the styrene derivative include $\alpha$-methylstyrene, 2-methylstyrene, 3-methyl styrene, 4-methyl styrene, 4-t-butyl styrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, vinylcyclohexane, 4-vinylbenzylchloride, 1-vinylnaphthalene, 4-vinylbiphenyl, 1-vinyl-2-pyrolidone, 9-vinylanthracene, and vinylpyridine.

Examples of the siloxane derivative include dimethylsiloxane, diethylsiloxane, diphenylsiloxane, and methylphenylsiloxane.

Examples of the alkylene oxide include ethylene oxide, propylene oxide, isopropylene oxide and butylene oxide.

In the present invention, it is preferable to use a block copolymer having a block with a structural unit of styrene or a derivative thereof bonded to a block with a structural unit of a (meth)acrylate ester. Specific examples thereof include a polystyrene-polymethyl methacrylate (PS-PMMA) block copolymer, a polystyrene-polyethyl methacrylate block copolymer, a polystyrene-(poly-t-butyl methacrylate) block copolymer, a polystyrene-polymethacrylic acid block copolymer, a polystyrene-polymethyl acrylate block copolymer, a polystyrene-polyethyl acrylate block copolymer, a polystyrene-(poly-t-butyl acrylate) block copolymer, and a polystyrene-polyacrylic acid block copolymer. In the present invention, it is particularly preferable to use a PS-PMMA block copolymer.

The weight average molecular weight (Mw) (the polystyrene equivalent value determined by gel permeation chromatography) of each block constituting the block copolymer is not particularly limited as long as it is large enough to cause phase separation. The weight average molecular weight is preferably 5,000 to 500,000, more preferably 10,000 to 400,000, and still more preferably 20,000 to 300,000.

The polydispersity (Mw/Mn) of the block copolymer is preferably 1.0 to 3.0, more preferably 1.0 to 1.5, and still more preferably 1.0 to 1.2. Here, Mn is the number average molecular weight.

Hereafter, among the blocks constituting the block copolymer, a block which is not selectively removed is referred to as "block $P_A$", and a block to be selectively removed is referred to as "block $P_B$". For example, after the phase separation of a layer containing a PS-PMMA block copolymer, by subjecting the layer to a decomposition treatment or a developing solution treatment, the phase of PMMA is selectively removed. In such a case, PS is the block $P_A$, and PMMA is the block $P_B$.

By appropriately controlling the compositional ratio of each block constituting the block copolymer and the weight average molecular weight of the block copolymer, the shape of each phase of the phase-separated structure to be obtained can be adjusted.

In the present invention, the volume fraction of the block $P_B$ within the entire block copolymer $\{[\text{block } P_B]/([\text{block } P_A]+[\text{block } P_B])\}$ is preferably 0.21 to 0.39, more preferably 0.25 to 0.35, and still more preferably 0.3. When the volume fraction of the block $P_B$ is within the above-mentioned range, it becomes possible to more reliably form a cylinder structure perpendicular to a surface of a substrate by the phase-separated structure of a phase of the block $P_B$ and a phase of the block $P_A$.

Further, with respect to the block copolymer used in the present invention, it is preferable that the period d2 of the block copolymer and the block diameter d1 of the block $P_B$ within the block copolymer satisfy the relation of the following formula (1). When d1 and d2 satisfy the relation of the following formula (1), it becomes possible to more reliably form one phase of a cylinder structure constituted of the block $P_B$ and the block $P_A$ at the center of one hole in a hole pattern formed on a thin film. The block diameter d1 of the block $P_B$ refers to the length of the phase to be selectively removed in the selective removing step, within the period of the phase structure observed when the phase-separated structure is formed.

$$d2 \times \sqrt{(0.29)} > d1 > d2 \times \sqrt{(0.17)} \tag{1}$$

Further, in the present invention, the hole diameter of the hole pattern formed on the thin film is preferably 0.8 to 3.1 fold of the period of the block copolymer used, more preferably 1 to 3 times, and still more preferably 1 to 2 times. When the period of the block copolymer is much smaller than the hole diameter of the hole pattern, in the hole pattern formed on the thin film, a plurality of phases having a cylinder structure constituted of the block $P_B$ are likely to be formed in one hole. On the other hand, when the period of the block copolymer is much larger than the hole diameter of the hole pattern, there is a tendency that the cylinder structure constituted of the block $P_B$ is unlikely to be formed. In the present invention, by virtue of using a block copolymer having an optimal period with respect to the size of the hole diameter of the hole pattern formed on the thin film, a phase of one cylinder structure can be more reliably formed near the center of one hole within a hole pattern by phase separation.

When the shape of the holes of the hole pattern formed on the thin film is a circle or a similar shape, the "hole diameter of hole pattern formed on the thin film" is the diameter of the hole. Further, when the shape of the holes is an ellipse or a similar shape, the "hole diameter of hole pattern formed on the thin film" includes both the major axis and the minor axis. That is, when the shape of the holes is an ellipse, the period of the block copolymer used is preferably ⅓ to 1 times the major axis of the hole, and ⅓ to 1 times the minor axis.

<Substrate>

The substrate is not particularly limited, as long as a thin film can be formed on a surface thereof, followed by forming a hole pattern on the thin film. Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

Further, the size and the shape of the substrate used in the present invention is not particularly limited. The substrate does not necessarily need to have a smooth surface, and a substrate made of various materials and having various shapes can be appropriately selected for use. For example, a multitude of shapes can be used, such as a substrate having a curved surface, a plate having an uneven surface, and a thin sheet.

Further, on the surface of the substrate, an inorganic and/or organic film may be provided. As the inorganic film, an inorganic antireflection film (inorganic BARC) can be used. As the organic film, an organic antireflection film (organic BARC) can be used.

<Substrate Washing Treatment>

Before forming a thin film on the substrate, the surface of the substrate may be washed. By washing the surface of the substrate, the later thin film forming step may be satisfactorily performed.

As the washing treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a layer containing a block copolymer can be formed on the surface of the substrate.

<Neutralization Treatment>

Before forming a thin film on the substrate, the substrate may be subjected to a neutralization treatment. In the case where a hole pattern is formed on the thin film, the surface of the substrate prior to the lamination of the thin film becomes the bottom of the hole. Thus, by subjecting the substrate to a neutralization treatment prior to formation of a thin film, the bottom of the holes of the hole pattern can be rendered a surface subjected to a neutralization treatment. A neutralization treatment is a treatment in which the surface of the substrate is modified so as to have affinity for all blocks constituting the block copolymer. By the neutralization treatment, it becomes possible to prevent only phases of specific blocks to come into contact with the surface of the substrate by phase separation, and it becomes possible to more reliably form the phase of the block $P_B$ into a cylinder structure oriented in a perpendicular direction of the substrate surface.

A specific example of the neutralization treatment includes a treatment in which a thin film (neutralization film) containing a base material having affinity for all blocks constituting the block copolymer is formed on the surface of the substrate.

As the neutralization film, a film composed of a resin composition can be used. The resin composition used as the base material can be appropriately selected from conventional resin compositions used for forming a thin film, depending on the type of blocks constituting the block copolymer. The resin composition used as the base material may be a heat-polymerizable resin composition, or a photosensitive resin composition such as a positive resist composition or a negative resist composition.

Alternatively, the neutralization film may be a non-polymerizable film. For example, a siloxane organic monomolecular film such as phenethyltrichlorosilane, octadecyltrichlorosilane or hexamethyldisilazane may be preferably used as a neutralization film.

The neutralization film composed of such base materials can be formed by a conventional method.

Examples of the base material include a resin composition containing all structural units of the blocks constituting the block copolymer, and a resin containing all structural units having high affinity for the blocks constituting the block copolymer.

For example, when a PS-PMMA block copolymer is used, as the base material, it is preferable to use a resin composition containing both PS and PMMA as the structural units, or a compound or a composition containing both a portion having a high affinity for PS such as an aromatic ring and a portion having a high affinity for PMMA such as a functional group with high polarity.

Examples of the resin composition containing both PS and PMMA as the structural units include a random copolymer of PS and PMMA, and an alternating block of PS and PMMA (a copolymer in which the respective monomers are alternately copolymerized).

Examples of the composition containing both a portion having a high affinity for PS and a portion having a high affinity for PMMA include a resin composition obtained by polymerizing at least a monomer having an aromatic ring and a monomer having a substituent with high polarity. Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom. Examples of the monomer having a substituent with high polarity include a monomer having a trimethoxysilyl group, a trichlorosilyl group, a carboxy group, a hydroxy group, a cyano group or a hydroxyalkyl group in which part of the hydrogen atoms of the alkyl group has been substituted with fluorine atoms.

Examples of the compound containing both a portion having a high affinity for PS and a portion having a high affinity for PMMA include a compound having both an aryl group such as a phenethyltrichlorosilane and a substituent with high polarity, and a compound having both an alkyl group and a substituent with high polarity, such as an alkylsilane compound.

<Formation of Thin Film Having Hole Pattern Formed Thereon>

On the surface of the substrate, before forming a layer containing the block copolymer, a thin film having a hole pattern formed thereon is formed. The thin film may be a photosensitive film or a non-photosensitive film. Further, the thin film may be an organic film or an inorganic film. In the present invention, a photosensitive or non-photosensitive organic film is preferable, and a photosensitive or non-photosensitive resist film is more preferable.

The method of forming a resist film having a hole pattern formed thereon is not particularly limited, and can be appropriately selected from the conventional methods for forming a hole pattern on a resist film. In the case of a photolithography method, for example, on a surface of a substrate which has been subjected to a washing treatment or a neutralization treatment if desired, a film composed of a resist composition is formed. Then, a selective exposure is conducted using a radial ray such as light or electron beam through a mask pattern having a predetermined hole pattern, followed by a development treatment, thereby forming a resist film having a hole pattern formed thereon.

The resist composition for forming the hole pattern can be appropriately selected from resist compositions or a modified product thereof typically used for forming a resist pattern. The resist composition may be a positive resist composition or a negative resist composition. Further, the developing solution used in the development may be an alkali developing solution or an organic developing solution containing an organic solvent.

For example, a hole pattern can be formed by using a positive resist composition containing a base component which exhibits increased solubility in an alkali developing solution under action of acid and an acid-generator component which generates acid upon exposure. In the positive resist composition, when radial rays are irradiated (when exposure is conducted), acid is generated from the acid-generator component, and the polarity of the base component is increased by the action of the acid, thereby increasing the solubility of the base component in an alkali developing solution. Therefore, in the formation of a hole pattern, by conducting selective exposure of a resist film formed by using the resist composition, the solubility of the exposed portions in an alkali developing solution is increased, whereas the unexposed portions remain hardly soluble in an alkali, and hence, a hole pattern can be formed by alkali development to remove the exposed portions, thereby forming a hole pattern. As the positive resist composition, a positive resist composition that includes a base component which exhibits increased solubility in an alkali developing solution under action of acid and generates acid upon exposure can be used.

More specifically, for example, a positive resist composition is applied to a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a mask having a hole pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a hole pattern that is faithful to the mask pattern can be formed.

Alternatively, a hole pattern can be formed by using a negative-tone development resist composition containing a base component which exhibits decreased solubility in a developing solution containing an organic solvent under action of acid and an acid-generator component which generates acid upon exposure. In the negative tone-development resist composition, when radial rays are irradiated (when exposure is conducted), acid is generated from the acid-generator component, and the solubility of the base component in an organic solvent is decreased by the action of the acid. Therefore, in the formation of a hole pattern, by conducting selective exposure of a resist film formed by using the resist composition, the solubility of the exposed portions in a developing solution containing an organic developing solution is decreased, whereas the solubility of the unexposed portions in an organic developing solution is unchanged, and hence, a hole pattern can be formed by removing the unexposed portions by negative tone development using an organic developing solution.

Alternatively, a hole pattern can be formed by using a negative resist composition containing a base component which is soluble in an alkali developing solution, an acid-generator component which generates acid upon exposure, and a cross-linking agent. In the negative resist composition, when acid is generated from the acid-generator component upon exposure, the action of the generated acid causes cross-linking between the base component and the cross-linking agent, and the cross-linked portion becomes hardly soluble in an alkali developing solution. Therefore, in the formation of a hole pattern, by conducting selective exposure of a resist film formed by using the resist composition, the exposed portions becomes hardly soluble in an alkali developing solution, whereas the unexposed portions remain soluble in an alkali developing solution, and hence, a hole pattern can be formed by alkali development to remove the unexposed portions, thereby forming a hole pattern.

Furthermore, a hole pattern can be formed using an etching treatment. For example, on a surface of a substrate which has been subjected to a washing treatment or a neutralization treatment if desired, a resist composition is coated to form a resist film. Then, a mask having a hole pattern and dry etching resistance is provided on the resist film, followed by dry etching treatment, thereby forming a resist film having a hole pattern formed thereon. Examples of the dry etching treatment include an oxygen plasma treatment, a hydrogen plasma treatment, an ozone treatment and a UV irradiation treatment.

Further, a hole pattern can be formed by a wet etching treatment. Specifically, a non-photosensitive resist film is formed on a surface of a substrate, and a photosensitive resist film is laminated on the non-photosensitive resist film, followed by forming a hole pattern on the photosensitive resist film. Thereafter, by using an organic solvent in which the non-photosensitive resist film exhibits a higher solubility than the photosensitive resist film, the non-photosensitive resist film is dissolved and removed in regions where the non-photosensitive resist film is not masked by the hole pattern, thereby forming a hole pattern on the non-photosensitive resist film. As the non-photosensitive resist film, a silica film such as a film containing $SiO_2$ as a main component can be preferably used. A film containing $SiO_2$ as a main component can be formed, for example, by applying a solution obtained by dissolving a silicon compound in an organic solvent, and a film can be formed by a spin-on-glass method (SOG method) involving a heat treatment, a chemical vapor deposition method, or the like. Further, the photosensitive resist composition can be appropriately selected from resist compositions or a modified product thereof typically used for forming a resist pattern.

The resist composition for forming the hole pattern can be appropriately selected from resist compositions or a modified product thereof typically used for forming a resist pattern which have affinity for any of the blocks constituting the block copolymer.

When an organic solvent solution of the block copolymer is cast onto the substrate having a hole pattern formed, a heat treatment is conducted to cause a phase separation. Therefore, the resist pattern for forming a hole pattern is preferably capable of forming a resist film which exhibits solvent resistance and heat resistance.

<Block Copolymer Layer Forming Step>

In the present invention, firstly, a layer containing a block copolymer having a plurality of blocks bonded is formed on a substrate having on a surface thereof a thin film with a hole pattern formed, so as to cover the thin film. More specifically, the block copolymer dissolved in a suitable organic solvent is applied to the thin film using a spinner or the like.

As the organic solvent for dissolving the block copolymer, any organic solvent which is capable of dissolving the block copolymer to be used and forming a uniform solution can be used, and an organic solvent having high compatibility with all of the blocks constituting the block copolymer can be used. As the organic solvent, one type of solvent can be used, or two or more types may be used in combination.

Examples of the organic solvent for dissolving the block copolymer include lactones such as γ-butyrolactone;

ketones such as acetone, methyl ethyl ketone, cyclohexanone, methyl-n-pentyl ketone, methyl isopentyl ketone, and 2-heptanone;

polyhydric alcohols, such as ethylene glycol, diethylene glycol, propylene glycol and dipropylene glycol;

compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable);

cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate;

and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

For example, when a PS-PMMA block copolymer is used as the block copolymer, it is preferable to dissolve the block copolymer in an aromatic organic solvent such as toluene, PGMEA, or the like.

In the present invention, the lower limit of the thickness of the layer containing the block copolymer can be a thickness sufficient for a phase separation to occur, and can be appropriately selected taking into consideration of the periodic structure size of the phase-separated structure to be formed. For example, when the thickness between the bottom of the hole of the hole pattern formed on the thin film and the surface of the layer containing the block copolymer is 50% or more, preferably 100% or more, based on the block diameter of the block $P_B$, it becomes possible to more efficiently form one phase of a cylinder structure constituted of the block $P_B$ and the block $P_A$ in one hole of the hole pattern formed on a thin film.

As the thickness of the layer containing the block copolymer becomes larger, a plurality of phases having a cylinder structure constituted of the block $P_B$ and the block $P_A$ are likely to be formed in one hole. Further, when the thickness of the layer containing the block copolymer becomes larger, it becomes difficult to form a phase constituted of the block $P_B$ perpendicular to the surface of the substrate. Therefore, the thickness between an upper face of the thin film and a surface of the layer containing the block copolymer is 70% or less of a thickness of the thin film, more preferably 60% or less, and still more preferably 40% or less.

A schematic diagram showing an embodiment of a substrate having a layer containing a block copolymer formed thereon by a block copolymer layer forming step is illustrated in FIG. 1. After forming a neutralization film 3 on a surface of a substrate 1 having an anti-reflection film 2 formed thereon, a layer 5 containing a block copolymer is formed on the substrate 1 having a thin film 4 with a hole pattern formed on a surface of the neutralization film 3, so as to cover the thin film 4. The thickness H between the upper face of the thin film 4 and a surface of the layer 5 containing the block copolymer is adjusted to be 70% or less of a thickness L of the thin film 4. It is preferable to adjust the thickness H' between the bottom of the hole of the hole pattern formed on the thin film 4 and the surface of the layer 5 containing the block copolymer to be 50% or more of the block diameter d1 of the block $P_B$.

<Phase Separation Step>

The substrate having the layer containing the block copolymer formed thereon is subjected to an annealing treatment, so as to cause a phase separation of the layer containing the block copolymer. As a result, one phase of a cylinder structure constituted of the block $P_B$ and the block $P_A$ is formed in one hole of the hole pattern formed on a thin film.

The annealing treatment can be any treatment which is used for causing phase separation of the block copolymer, such as a heat annealing treatment or a solvent annealing treatment. Specifically, in a heat annealing treatment, the substrate having the layer containing the block copolymer formed thereon is subjected to a heat treatment. The heat treatment is preferably conducted at a temperature at least as high as the glass transition temperature of the block copolymer used and lower than the heat decomposition temperature. Further, the heat treatment is preferably conducted in a low reactive gas such as nitrogen.

On the other hand, the solvent annealing treatment is a method in which the annealing treatment is conducted in a state where the substrate having the layer containing the block copolymer formed thereon is exposed to a vapor of a good solvent for a polymeric block copolymer composition. In the solvent annealing treatment, the substrate exposed to the vapor of the good solvent may be further subjected to a heat treatment.

Specifically, for example, the substrate having the layer containing the block copolymer formed thereon is placed in a desiccator with a good solvent for a polymeric block copolymer composition, and allowed to stand. Alternatively, a nitrogen gas may be bubbled in a good solvent for a polymeric block copolymer composition to obtain a good solvent vapor-containing nitrogen gas, and the substrate having the layer containing the block copolymer formed thereon may be subjected to a heat treatment in a state where the good solvent vapor-containing nitrogen gas is introduced.

<Selective Removing Step>

Subsequently, after the formation of the phase separation structure, the phase of block $P_B$ exposed is selectively removed from the layer containing the block copolymer formed on the substrate. As a result, only the phase of the block $P_A$ remains on the exposed surface of the substrate. Thus, on the substrate, a CH pattern is formed which is constituted of only the block $P_A$, wherein the CH pattern has a hole diameter smaller than the hole pattern originally formed on the thin film, and exhibits improved uniformity of the hole diameter and circularity.

The selective removing treatment is not particularly limited, as long as it is a treatment capable of decomposing and removing the block $P_B$ without affecting the block $P_A$, and may be conducted by a dry etching method or a liquid etching method. Dry etching is a method in which a reactive gas is blown on the nanophase-separated structure, and selective removal is conducted by using the difference in the decomposition rate of the blocks by the dry gas. Specific examples include an oxygen plasma treatment, a hydrogen plasma treatment and an ozone treatment.

On the other hand, the liquid etching method is a method in which polymer in a specific block region of the nanophase-separated structure is selectively decomposed if desired, followed by immersing the nanophase-separated structure in a developing solution containing an organic solvent as a main component, so as to preferentially dissolve and remove a specific phase portion. In the case of liquid etching method, prior to immersing in a developing solution, among the layer containing the block copolymer formed on the substrate after forming the nanophase-separated structure, at least a portion of the phase constituted of the block $P_B$ is decomposed (the molecular weight is decreased). By decomposing a portion of the block $P_B$ in advance, the solubility in a developing solution can be enhanced. As a result, the phase constituted of the block $P_B$ can be more reliably removed by selective removing than the phase constituted of the block $P_A$.

The decomposition treatment is not particularly limited, as long as it is a treatment capable of decomposing the block $P_B$ with priority to the block $P_A$. The decomposition treatment can be appropriately selected from any methods for decomposing blocks, depending on the types of the block $P_A$ and the block $P_B$. Examples of the decomposition treatment include an ultraviolet (UV) irradiation treatment, a heat decomposition treatment and a chemical decomposition treatment.

EXAMPLES

As follows is a description of examples of the present invention, although the scope of the present invention is by no way limited by these examples.

Production Example 1

A resist composition solution for forming a resist film on which a hole pattern is to be formed was produced.

Specifically, 100 parts by weight of a polymer represented by formula (A)-1 shown below (Mw: 10,000; polydispersity index (PDI): 1.7), 10 parts by weight of a photoacid generator represented by formula (B)-1 shown below (manufactured by Wako Pure Chemical Industries, Ltd.), 1.2 parts by weight of tri-n-amylamine, 2.0 parts by weight of salicylic acid, and 2,500 parts by weight of PGMEA were mixed together, thereby producing a resist composition solution. In formula (A)-1, the subscript numerals shown on the bottom right of the parentheses ( ) indicate the percentage (mol %) of the respective structural units.

[Chemical Formula 1]

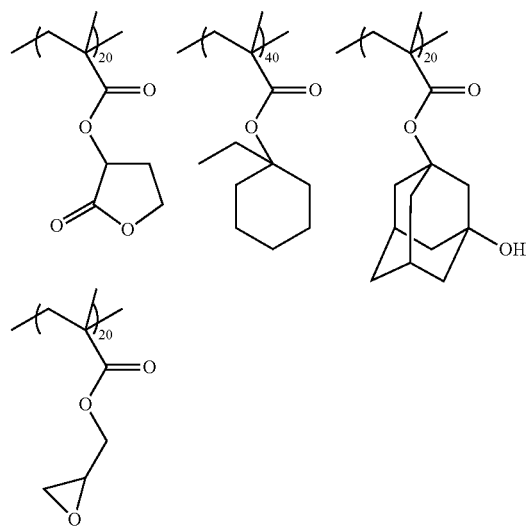

(A)-1

[Chemical Formula 2]

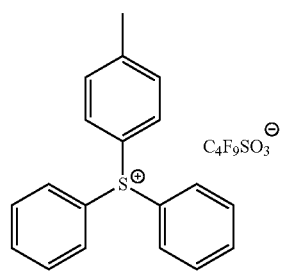

(B)-1

Example 1

First, an organic antireflection film composition (product name: ARC-29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 85 nm.

Then, the resist composition solution produced in Production Example 1 was applied to the organic antireflection film using a spinner, and was then prebaked (PAB) on a hotplate at 85° C. for 60 seconds and dried, thereby forming a resist film for forming a hole pattern having a film thickness of 100 nm.

Subsequently, the resist film for forming a hole pattern was selectively irradiated with an ArF excimer laser (193 nm) through a mask pattern (6% half tone) for forming holes having a hole diameter indicated in Table 1 under "mask C.D." and a pitch of 158 nm, using an ArF exposure apparatus NSR-S308F (manufactured by Nikon Corporation, NA (numerical aperture)=0.92). Next, post exposure bake (PEB) was conducted at 125° C. for 60 seconds, and development was performed for 16 seconds using butyl acetate, followed by drying by shaking. Further, a post bake treatment was conducted at 100° C. for 1 minute, followed by 200° C. for 5 minutes. As a result, a hole pattern having a hole diameter indicated in Table 1 under "pattern C.D." and a pitch of 158 nm was formed. After the sequence of the above treatments, the thickness of the resist film was 60 nm.

On the substrate, a PGMEA solution (0.8 wt %) of a PS-PMMA block copolymer 1 (molecular weight of PS: 45,000; molecular weight of PMMA: 20,000; PDI: 1.07; period: 36.5 nm; block diameter of PMMA: 20 nm) was spin-coated (revolution rate: 1,500 rpm; 60 seconds), such that the thickness of the coating as measured from the upper face of the resist composition for forming a hole pattern became 20 nm, 45 nm or 60 nm, followed by prebaking (PAB) at 110° C. for 60 seconds, thereby forming a layer containing the PS-PMMA block copolymer 1. Subsequently, the substrate was heated at 240° C. for 60 seconds while flowing nitrogen, thereby forming a phase-separated structure.

Thereafter, using TCA-3822 (product name; manufactured by Tokyo Ohka Kogyo Co., Ltd.), the substrate was subjected to an oxygen plasma treatment (200 sccm, 40 Pa, 200W, 40° C., 20 seconds), thereby selectively removing the phase constituted of PMMA.

The surface of the obtained substrate was observed using a scanning electron microscope SU8000 (manufactured by Hitachi High-Technologies Corporation). The formation of the CH pattern was evaluated with the following criteria. A: one hole formed by a phase constituted of PS was formed per one hole originally formed on the resist film for forming a hole pattern; B: a plurality of holes formed by a phase constituted of PS was formed per one hole originally formed on the resist film for forming a hole pattern; C: no holes were formed. Further, with respect to each of the formed CH patterns, the diameter of 9 holes was measured. From the results, the uniformity of the hole diameter was evaluated with the following criteria. A: the value of 3 times the standard deviation was less than 2.0, B: the value of 3 times the standard deviation was from 2.0 to 3.0, C: the value of 3 times the standard deviation was more than 3.0. Further, measurement was conducted using a CD-SEM (manufactured by Hitachi High-Technologies Corporation). From the standard deviation of the measured value of a radial measurement using the operating software, the circularity of the holes was evaluated with the following criteria. A: the value of 3 times the standard deviation was less than 1.5, B: the value of 3 times the standard deviation was from 1.5 to 3.0, C: the value of 3 times the standard deviation was more than 3.0. The results of patterns in which the thickness between the upper face of the resist film for forming a hole pattern and the upper face of the layer containing the PS-PMMA block copolymer 1 (hereafter, sometimes referred to as "thickness H") was 20 nm are shown in Table 1. The results of patterns in which the thickness H was 45 nm are shown in Table 2. The results of patterns in which the thickness H was 60 nm are shown in Table 3. In Tables 2 and 3, "-" indicates that the measurement could not be conducted.

TABLE 1

Thickness H: 20 nm

| Mask C.D. (nm) | Pattern C.D. (nm) | CH pattern formation | Uniformity of hole diameter | Circularity |
|---|---|---|---|---|
| 75 | 60.7 | A | A | A |
| 80 | 72.3 | A | A | A |
| 85 | 76.8 | A | A | A |
| 90 | 78.8 | A | A | A |
| 95 | 85.7 | A | A | A |
| 100 | 93 | A | A | A |
| 105 | 101 | A | A | A |
| 110 | 105 | A | A | A |
| 115 | 114 | A | A | A |
| 120 | 122 | B | A | A |
| 130 | 138 | B | A | A |
| 140 | 156 | B | A | A |
| 150 | 167 | B | A | A |
| 200 | 233 | B | A | A |
| 300 | 331 | B | C | C |

TABLE 2

Thickness H: 45 nm

| Mask C.D. (nm) | Pattern C.D. (nm) | CH pattern formation | Uniformity of hole diameter | Circularity |
|---|---|---|---|---|
| 75 | 60.7 | C | — | — |
| 80 | 72.3 | C | — | — |
| 85 | 76.8 | B | B | B |
| 90 | 78.8 | B | B | B |
| 95 | 85.7 | B | B | B |
| 100 | 93 | B | B | B |
| 105 | 101 | B | B | B |
| 110 | 105 | B | B | B |
| 115 | 114 | B | B | B |
| 120 | 122 | B | B | B |
| 130 | 138 | B | B | B |
| 140 | 156 | B | B | B |
| 150 | 167 | B | B | B |
| 200 | 233 | B | B | B |
| 300 | 331 | B | B | B |

TABLE 3

Thickness H: 60 nm

| Mask C.D. (nm) | Pattern C.D. (nm) | CH pattern formation | Uniformity of hole diameter | Circularity |
|---|---|---|---|---|
| 75 | 60.7 | C | — | — |
| 80 | 72.3 | C | — | — |
| 85 | 76.8 | C | — | — |
| 90 | 78.8 | C | — | — |
| 95 | 85.7 | C | — | — |
| 100 | 93 | C | — | — |
| 105 | 101 | C | — | — |
| 110 | 105 | C | — | — |
| 115 | 114 | C | — | — |
| 120 | 122 | C | — | — |
| 130 | 138 | C | — | — |
| 140 | 156 | C | — | — |
| 150 | 167 | C | — | — |
| 200 | 233 | C | — | — |
| 300 | 331 | C | — | — |

As a result, in the case where the thickness H was 60 nm (i.e., 100% or more of the thickness of the resist film for forming a hole pattern (60 nm)), holes could not be formed by selective removal of the PMMA phase after the phase separation. On the other hand, in the case where the thickness H was 20 nm (i.e., no more than 60%, based on the thickness of the resist film for forming a hole pattern (60 nm)), when the hole diameter was 60.7 to 114 nm (i.e., 1.65 to 3.1 times the period of the PS-PMMA block copolymer 1), 1 hole formed by a phase constituted of PS was formed per 1 hole. However, when the hole diameter was 122 nm or more, a plurality of holes formed by a phase constituted of PS were formed per 1 hole. When the hole diameter was 122 to 233 nm, the uniformity and the circularity of the formed holes were excellent. Further, in the case where the thickness H was 45 nm (i.e., 75%, based on the thickness of the resist film for forming a hole pattern (60 nm)), when the hole diameter was 60.7 to 72.3 nm, holes could not be formed. When the hole diameter was 76.8 nm or more, although holes could be formed, a plurality of holes were formed per 1 hole on the resist film for forming a hole pattern. Moreover, with respect to the formed holes, the uniformity and the circularity of the holes were not good.

Example 2

A hole pattern was formed on a resist pattern for forming a hole pattern on a substrate in the same manner as in Example 1, except that the PS-PMMA block copolymer 1 was changed to a PS-PMMA block copolymer 2 (molecular weight of PS: 95,500; molecular weight of PMMA: 35,500; PDI: 1.11; period: 73.5 nm; block diameter of PMMA: 40 nm), thereby forming a layer containing the PS-PMMA block copolymer 2. After a phase separation, the phase constituted of PMMA was selectively removed, and the surface of the obtained substrate was observed, so as to make evaluations in the same manner as in Example 1. The results are shown in Tables 4 to 6.

TABLE 4

Thickness H: 20 nm

| Mask C.D. (nm) | Pattern C.D. (nm) | CH pattern formation | Uniformity of hole diameter | Circularity |
|---|---|---|---|---|
| 75  | 60.7 | A | A | A |
| 80  | 72.3 | A | A | A |
| 85  | 76.8 | A | A | A |
| 90  | 78.8 | A | A | A |
| 95  | 85.7 | A | A | A |
| 100 | 93   | A | A | A |
| 105 | 101  | A | A | A |
| 110 | 105  | A | A | A |
| 115 | 114  | A | A | A |
| 120 | 122  | A | A | A |
| 130 | 138  | A | A | A |
| 140 | 156  | A | A | A |
| 150 | 167  | B | A | A |
| 200 | 233  | C | — | — |
| 300 | 331  | C | — | — |

TABLE 5

Thickness H: 40 nm

| Mask C.D. (nm) | Pattern C.D. (nm) | CH pattern formation | Uniformity of hole diameter | Circularity |
|---|---|---|---|---|
| 75 | 60.7 | A | A | A |
| 80 | 72.3 | A | A | A |
| 85 | 76.8 | A | A | A |
| 90 | 78.8 | A | A | A |
| 95 | 85.7 | A | A | A |

TABLE 5-continued

Thickness H: 40 nm

| Mask C.D. (nm) | Pattern C.D. (nm) | CH pattern formation | Uniformity of hole diameter | Circularity |
|---|---|---|---|---|
| 100 | 93  | A | A | A |
| 105 | 101 | A | A | A |
| 110 | 105 | A | A | A |
| 115 | 114 | A | A | A |
| 120 | 122 | A | A | A |
| 130 | 138 | A | A | A |
| 140 | 156 | A | A | A |
| 150 | 167 | B | A | A |
| 200 | 233 | B | A | A |
| 300 | 331 | B | A | A |

TABLE 6

Thickness H: 60 nm

| Mask C.D. (nm) | Pattern C.D. (nm) | CH pattern formation | Uniformity of hole diameter | Circularity |
|---|---|---|---|---|
| 75  | 60.7 | C | — | — |
| 80  | 72.3 | C | — | — |
| 85  | 76.8 | C | — | — |
| 90  | 78.8 | C | — | — |
| 95  | 85.7 | C | — | — |
| 100 | 93   | C | — | — |
| 105 | 101  | C | — | — |
| 110 | 105  | C | — | — |
| 115 | 114  | C | — | — |
| 120 | 122  | C | — | — |
| 130 | 138  | C | — | — |
| 140 | 156  | C | — | — |
| 150 | 167  | C | — | — |
| 200 | 233  | C | — | — |
| 300 | 331  | C | — | — |

As a result, in the case where the thickness H was 60 nm (i.e., 100% or more of the thickness of the resist film for forming a hole pattern (60 nm)), holes could not be formed by selective removal of the PMMA phase after the phase separation. Further, in the case where the thickness H was 20 nm or 40 nm (i.e., no more than 70% of the thickness of the resist film for forming a hole pattern (60 nm)), when the hole diameter was 60.7 to 156 nm (i.e., 0.83 to 2.12 times the period of the PS-PMMA block copolymer 2), 1 hole formed by a phase constituted of PS was formed per 1 hole. On the other hand, in the case where the thickness H was 40 nm, when the hole diameter was 167 nm or more, a plurality of holes were formed per 1 hole on the resist film for forming a hole pattern. Further, in the case where the thickness H was 20 nm, when the hole diameter was 167 nm (i.e., 2.27 times the period of the PS-PMMA block copolymer 2), a plurality of holes were formed per 1 hole, and when the hole diameter was 233 nm or more (i.e., 3.17 times the period of the PS-PMMA block copolymer 2), holes could not be formed. In the case where the thickness was 20 nm or 40 nm, the formed holes exhibited excellent uniformity of the hole diameter and circularity.

Example 3

First, an organic antireflection film composition (product name: ARC-29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 85 nm.

Then, a 0.4 wt % PGMEA solution of styrene/3,4-epoxycyclohexylmethane methacrylate/propyltrimethoxysilane methacrylate (compositional ratio: 75/20/5; Mw: 40,000; PDI: 1.7) was spin-coated on the organic antireflection film, followed by a prebaking treatment (PAB) at 250° C. for 60 seconds, thereby forming a neutralization film (film thickness: 10 nm).

To the neutralization film, in the same manner as in Example 1, the resist composition solution produced in Production Example 1 was applied, and a hole pattern was formed on the obtained resist film for forming a hole pattern. Then, a layer containing the PS-PMMA block copolymer 1 was formed, followed by phase separation. Thereafter, the phase constituted of PMMA was selectively removed, and the surface of the obtained substrate was observed.

As a result, like in Example 1, in the case where the thickness H was 60 nm, holes could not be formed by the selective removal of the PMMA phase after the phase separation. In the case where the thickness H was 20 nm, when the hole diameter of the hole on the resist film for forming a hole pattern was no more than 3.1 times the period of the PS-PMMA block copolymer 1, 1 hole was formed per 1 hole.

Example 4

A hole pattern was formed on a resist pattern for forming a hole pattern on a substrate having an organic antireflection film (underlayer) and a neutralization film thereon in the same manner as in Example 1, except that the PS-PMMA block copolymer 1 was changed to the PS-PMMA block copolymer 2 used in Example 3, thereby forming a layer containing the PS-PMMA block copolymer 2. After a phase separation, the phase constituted of PMMA was selectively removed, and the surface of the obtained substrate was observed.

As a result, like in Example 2, in the case where the thickness H was 60 nm, holes could not be formed by the selective removal of the PMMA phase after the phase separation. In the case where the thickness H was 20 nm or 40 nm, when the hole diameter of the hole on the resist film for forming a hole pattern was 0.83 to 2.12 times the period of the PS-PMMA block copolymer 2, 1 hole was formed per 1 hole.

Example 5

A hole pattern was formed on a resist film for forming a hole pattern in the same manner as in Example 1. Then, a layer containing the PS-PMMA block copolymer 1 was formed, followed by phase separation. Subsequently, instead of the oxygen plasma treatment, UV was irradiated using an ozoneless low pressure mercury lamp SSP17-110 (254 nm) (manufactured by SEN LIGHTS Co., Ltd.; low pressure mercury lamp: SUV110GS-36; illuminance: 16 mW/cm$^2$) for 2 minutes while flowing nitrogen, followed by immersing the substrate in toluene (special grade) for 15 seconds to selectively remove the phase constituted of PMMA. Thereafter, the substrate was dried with a nitrogen gas wind, and the surface of the obtained substrate was observed.

As a result, like in Example 1, in the case where the thickness H was 60 nm, holes could not be formed by the selective removal of the PMMA phase after the phase separation. In the case where the thickness H was 20 nm, when the hole diameter of the hole on the resist film for forming a hole pattern was no more than 3.1 times the period of the PS-PMMA block copolymer 1, 1 hole was formed per 1 hole.

Example 6

A hole pattern was formed on a resist pattern for forming a hole pattern on a substrate in the same manner as in Example 1. Then, with the exception of changing the PS-PMMA block copolymer 1 to a PS-PMMA block copolymer 3 (molecular weight of PS: 40,000; molecular weight of PMMA: 20,000; PDI: 1.07; period: 34.7 nm; block diameter of PMMA: 20 nm), a layer containing the PS-PMMA block copolymer 3 was formed in the same manner as in Example 1. After a phase separation, the phase constituted of PMMA was selectively removed, and the surface of the obtained substrate was observed, so as to make evaluations in the same manner as in Example 1. The results are shown in Tables 7 to 9.

TABLE 7

Thickness H: 20 nm

| Mask C.D. (nm) | Pattern C.D. (nm) | CH pattern formation | Uniformity of hole diameter | Circularity |
|---|---|---|---|---|
| 75 | 60.7 | A | A | A |
| 80 | 72.3 | A | A | A |
| 85 | 76.8 | A | A | A |
| 90 | 78.8 | A | A | A |
| 95 | 85.7 | A | A | A |
| 100 | 93 | A | A | A |
| 105 | 101 | A | A | A |
| 110 | 105 | A | A | A |
| 115 | 114 | A | A | A |
| 120 | 122 | B | A | A |
| 130 | 138 | B | A | A |
| 140 | 156 | B | A | A |
| 150 | 167 | B | A | A |
| 200 | 233 | B | — | — |
| 300 | 331 | B | — | — |

TABLE 8

Thickness H: 40 nm

| Mask C.D. (nm) | Pattern C.D. (nm) | CH pattern formation | Uniformity of hole diameter | Circularity |
|---|---|---|---|---|
| 75 | 60.7 | C | — | — |
| 80 | 72.3 | C | — | — |
| 85 | 76.8 | B | B | B |
| 90 | 78.8 | B | B | B |
| 95 | 85.7 | B | B | B |
| 100 | 93 | B | B | B |
| 105 | 101 | B | B | B |
| 110 | 105 | B | B | B |
| 115 | 114 | B | B | B |
| 120 | 122 | B | B | B |
| 130 | 138 | B | B | B |
| 140 | 156 | B | B | B |
| 150 | 167 | B | B | B |
| 200 | 233 | B | B | B |
| 300 | 331 | B | B | B |

TABLE 9

Thickness H: 60 nm

| Mask C.D. (nm) | Pattern C.D. (nm) | CH pattern formation | Uniformity of hole diameter | Circularity |
|---|---|---|---|---|
| 75 | 60.7 | C | — | — |
| 80 | 72.3 | C | — | — |
| 85 | 76.8 | C | — | — |
| 90 | 78.8 | C | — | — |
| 95 | 85.7 | C | — | — |
| 100 | 93 | C | — | — |
| 105 | 101 | C | — | — |
| 110 | 105 | C | — | — |
| 115 | 114 | C | — | — |
| 120 | 122 | C | — | — |
| 130 | 138 | C | — | — |

TABLE 9-continued

Thickness H: 60 nm

| Mask C.D. (nm) | Pattern C.D. (nm) | CH pattern formation | Uniformity of hole diameter | Circularity |
|---|---|---|---|---|
| 140 | 156 | C | — | — |
| 150 | 167 | C | — | — |
| 200 | 233 | C | — | — |
| 300 | 331 | C | — | — |

As a result, in the case where the thickness H was 60 nm (i.e., 100% or more of the thickness of the resist film for forming a hole pattern (60 nm)), holes could not be formed by selective removal of the PMMA phase after the phase separation. Further, in the case where the thickness H was 20 nm, when the hole diameter was 60.7 to 114 nm (i.e., 1.75 to 3.29 times the period of the PS-PMMA block copolymer 3), 1 hole formed by a phase constituted of PS was formed per 1 hole, and the formed holes exhibited excellent uniformity of the hole diameter and circularity. On the other hand, in the case where the thickness H was 40 nm, when the hole diameter was 60.7 to 72.3 nm, holes could not be formed. When the hole diameter was 76.8 nm or more, although holes could be formed, a plurality of holes were formed per 1 hole on the resist film for forming a hole pattern. Moreover, with respect to the formed holes, the uniformity and the circularity of the holes were not good.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a contact hole pattern, comprising:
a hole pattern forming step in which a resist film having a hole pattern is formed on a substrate the hole pattern having cylindrical holes arranged perpendicular to the substrate;
a block copolymer layer forming step in which a layer containing a block copolymer having a plurality of blocks bonded is formed on the resist film, so as to cover the resist film;
a phase separation step in which, after the block copolymer layer forming step, the layer containing the block copolymer is subjected to phase separation;
a selective removing step in which, after the phase separation step, a phase of at least one block of the plurality of blocks constituting the block copolymer is removed, so as to form one cylinder structure in each of the cylindrical holes of the hole pattern,
wherein a hole diameter of each cylindrical hole of the hole pattern formed on the resist film is 0.8 to 3.1 times a period of the block copolymer, and
in the block copolymer layer forming step, a thickness between an upper face of the resist film and a top surface of the layer containing the block copolymer is 70% or less of a thickness of the resist film.

2. The method of forming a contact hole pattern according to claim 1, wherein a block diameter (d 1) of a block constituting a phase selectively removed in the selective removing step and a period (d 2) of the block copolymer satisfies formula (1) shown below:

$$d2\times\sqrt{(0.29)} > d1 > d2\times\sqrt{(0.17)}. \quad (1)$$

3. The method of forming a contact hole pattern according to claim 1, wherein, in the block copolymer layer forming step, a thickness between bottom of a hole of the hole pattern formed on the thin film and a surface of the layer containing the block copolymer is adjusted to be 50% or more of a block diameter of a block constituting a phase selectively removed in the selective removing step.

4. The method of forming a contact hole pattern according to claim 1, wherein the block copolymer comprises polystyrene and polymethyl methacrylate.

* * * * *